United States Patent [19]
Kikuchi et al.

[11] Patent Number: 5,347,085
[45] Date of Patent: Sep. 13, 1994

[54] MULTIFILAMENTARY OXIDE SUPERCONDUCTING WIRES AND METHOD OF MANUFACTURING THE SAME

[75] Inventors: Hiroyuki Kikuchi; Masanao Mimura; Naoki Uno; Yasuzo Tanaka, all of Tokyo, Japan

[73] Assignee: The Furukawa Electric Co., Ltd., Tokyo, Japan

[21] Appl. No.: 828,471

[22] Filed: Jan. 30, 1992

[30] Foreign Application Priority Data

| Feb. 7, 1991 [JP] Japan | 3-038124 |
| Feb. 7, 1991 [JP] Japan | 3-038125 |
| Feb. 13, 1991 [JP] Japan | 3-041072 |

[51] Int. Cl.⁵ ........................................ H01B 12/00
[52] U.S. Cl. ........................................ 505/231; 505/1; 505/704; 505/884; 505/887; 174/125.1
[58] Field of Search ........... 174/15.4, 15.5, 125.1; 505/1, 706, 885, 884, 887, 704; 29/599

[56] References Cited

FOREIGN PATENT DOCUMENTS

| 0428993A2 | 5/1991 | European Pat. Off. |
| 0472333A2 | 2/1992 | European Pat. Off. |
| 0310510 | 12/1988 | Japan ................ 505/884 |
| 0017323 | 1/1989 | Japan ................ 505/1 |
| 0054611 | 3/1989 | Japan ................ 505/884 |
| 0105408 | 4/1989 | Japan ................ 505/885 |

OTHER PUBLICATIONS

Patent Abstracts of Japan, vol. 16, No. 162, Apr. 1992, & JP-A-40 12 412, Japan Atom Energy Research Institute, Ando Toshinari, Superconductive Conductor.

Primary Examiner—Leo P. Picard
Assistant Examiner—Hyung S. Sough
Attorney, Agent, or Firm—Frishauf, Holtz, Goodman & Woodward

[57] ABSTRACT

A multifilamentary oxide superconducting wire includes a metal matrix and a plurality of flat oxide superconductor filaments arranged in the metal matrix such that wide directions thereof are radially arranged in a section of the metal matrix. A method of manufacturing a multifilamentary oxide superconducting wire includes the steps of filling a raw material of an oxide superconductor in a through hole of a metal member to form a composite billet, subjecting the composite billet to a diameter reduction process to form a composite wire having a fan-like section, arranging composite wires so that larger arcs of the composite wires are located on the outer side, thus forming form a composite wire arrangement, covering the composite wire arrangement with a metal member to form a metal-covered composite wire arrangement, and performing a predetermined heating process of the metal-covered composite wire arrangement, thus forming the raw material into an oxide superconductor.

6 Claims, 13 Drawing Sheets

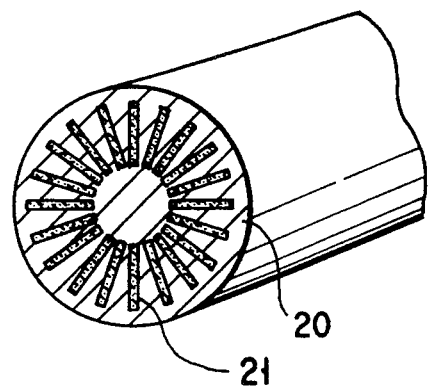
F I G. 2A
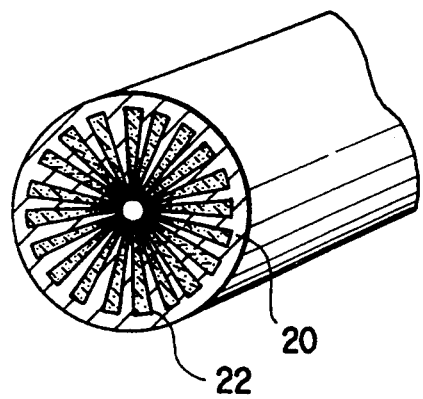
F I G. 2B
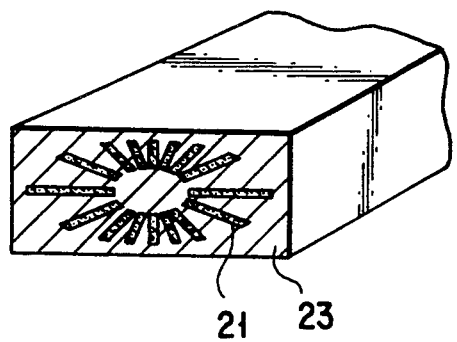
F I G. 2C

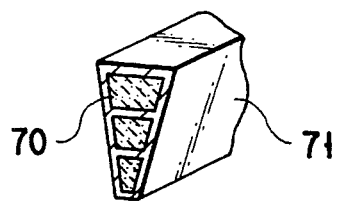
F I G. 7A
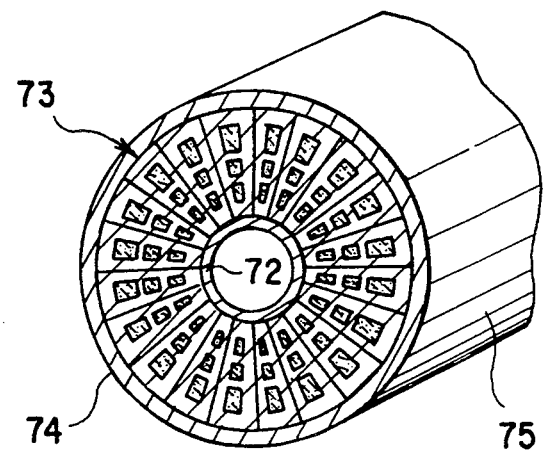
F I G. 7B
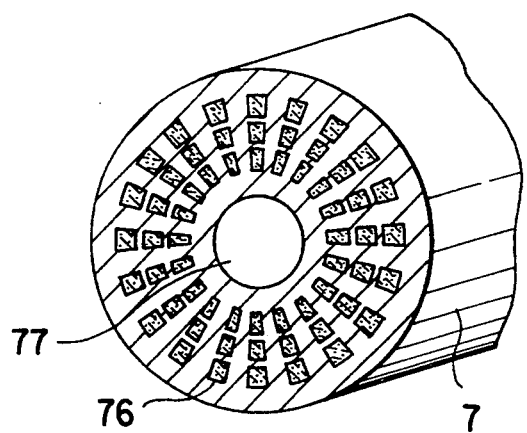
F I G. 7C

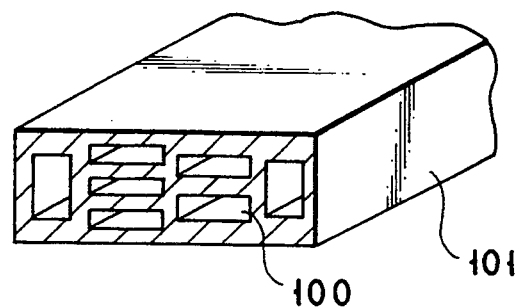
F I G. 10A
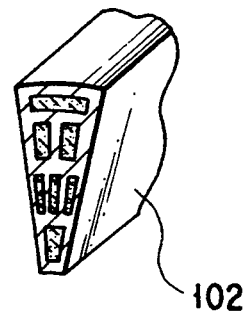
F I G. 10B

MULTIFILAMENTARY OXIDE SUPERCONDUCTING WIRES AND METHOD OF MANUFACTURING THE SAME

BACKGROUND OF THE INVENTION

1. Field of the Invention

The present invention relates to a multifilamentary oxide superconducting wire having an excellent superconducting property, and a method of efficiently obtaining such a multifilamentary oxide superconducting wire.

2. Description of the Related Art

Recently, Bi—Sr—Ca—Cu—O—, Y—Ba—Cu—O—, and Tl—Ba—Ca—Cu—O-based oxide superconductors whose critical temperatures exceed the temperature of liquid nitrogen are found, and studies on a variety of their applications are being made in various fields.

These oxide superconductors are brittle. Hence, to form them into oxide superconducting wires having predetermined shapes, for example, a raw material of an oxide superconductor is filled in a metal pipe to form a composite billet, and the composite billet is subjected to a diameter reduction process to obtain a desired shape. When a predetermined heating process is performed, the raw material is reacted to form an oxide superconductor, thereby obtaining a singlefilamentary oxide superconducting wire.

A multifilamentary oxide superconducting wire is manufactured in the following manner. That is, a multiple of oxide superconducting wires described above are arranged in a metal pipe, subjected to a diameter reduction process to obtain a desired shape, and subjected to a predetermined heating process. Alternatively, a plurality of through holes are formed in a metal billet, the raw material described above is filled in the through holes to form a composite billet, and the composite billet is subjected to a diameter reduction process to obtain a desired shape, and subjected to a predetermined heating process.

However, these methods provide either a multifilamentary oxide superconducting wire in which oxide superconductor filaments 11 each having a circular section are dispersed and composed in a metal matrix 10, as shown in FIG. 1A, or a multifilamentary oxide superconducting wire in which oxide superconductor filaments 12 each having a flat rectangular section are aligned in a predetermined direction and composed in a metal matrix 10, as shown in FIG. 1B.

The former cannot obtain a high superconducting property since the packing density of the oxide superconductor filaments 11 is low and the degree of c-axis orientation of the superconductor is low. In the latter, since the oxide superconductor filaments 12 each having the flat rectangular section are aligned only in the predetermined direction, the oxide superconductor filaments 12 become barriers against thermal conduction interfering with thermal conduction in the direction of thickness. As a result, the cooling capability of the multifilamentary oxide superconductor as a whole is decreased, and high superconducting property (such as critical temperature, critical current) cannot be obtained.

In the method of arranging multiple singlefilamentary oxide superconducting wires in the metal pipe, moreover it is difficult to align the singlefilamentary oxide superconducting wires in the metal pipe, and some oxide superconductor filaments inevitably intersect with each other in the obtained oxide superconductor. Since the intersecting portion is abnormally deformed, a high superconducting property cannot be obtained.

The method of forming a plurality of through holes in the metal billet is not preferable since the hole forming operation requires much labor, especially when the number of holes is large.

SUMMARY OF THE INVENTION

It is an object of the present invention to provide a multifilamentary oxide superconducting wire which exhibits an excellent superconducting property.

This object is further achieved by a multifilamentary oxide superconducting wire having a metal matrix and a plurality of flat oxide superconductor filaments arranged in the metal matrix such that wide directions thereof are radially arranged in a section of the metal matrix.

This object is further achieved by multifilamentary oxide superconducting wire having a metal matrix and a plurality of fan-like superconducting filaments arranged in the metal matrix such that their arcuated portions are on the outer side.

It is another object of the present invention to provide a method of manufacturing a multifilamentary oxide superconducting wire in which a multifilamentary oxide superconductor which exhibits an excellent superconducting property can be obtained.

This object is achieved by a method of manufacturing a multifilamentary oxide superconducting wire having steps of filling a raw material of an oxide superconductor in a through hole of a metal member having the through hole to form a composite billet, subjecting the composite billet to a diameter reduction process to form a composite wire having a flat or fanlike section, arranging the composite wires so that larger arcs thereof are located on the outer side, thus forming a composite wire arrangement, covering the composite wire arrangement with a metal member to form a metal-covered arrangement, and performing a predetermined heating process of the metal-covered arrangement to form the raw material into an oxide superconductor.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 2A to 2F are views showing sections of multifilamentary oxide superconducting wires according to the present invention;

FIGS. 4A to 4C, 6A to 6H, 7A to 7C, and 11A to 11C are views for explaining methods of manufacturing a multifilamentary oxide superconducting wires according to other embodiments of the present invention;

FIGS. 9A and 9B and 10A and 10B are views showing plate-like metal members used in the present invention.

DETAILED DESCRIPTION OF THE PREFERRED EMBODIMENTS

Multifilamentary oxide superconducting wires according to the present invention will be described with reference to the accompanying drawings.

Figure 2D:
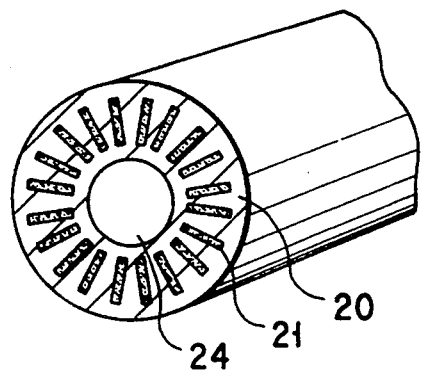
Figure 2E:
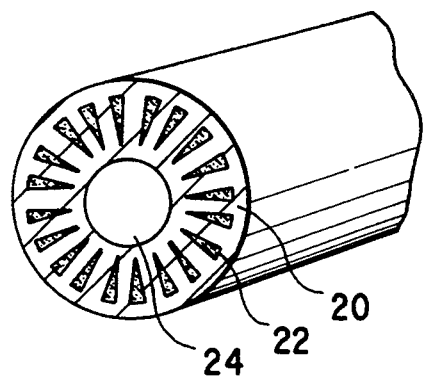
Figure 2F:
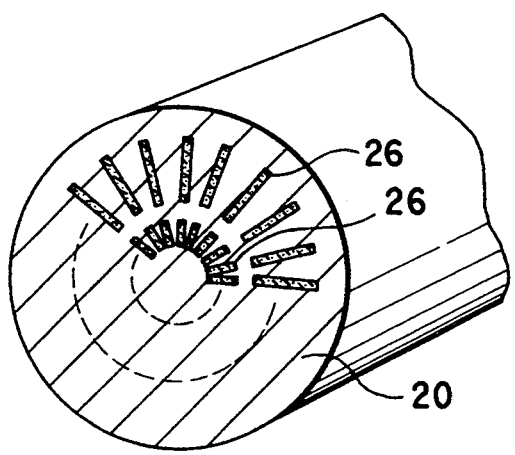

A multifilamentary oxide superconducting wire according to the present invention is obtained by arranging and composing oxide superconductor filaments 21 each having a flat section in a metal matrix 20 such that their wide directions are radially arranged, as shown in FIG. 2A. A multifilamentary oxide superconducting wire shown in FIG. 2B has oxide superconductor filaments 22 each having a fan-like section. with this structure, the area of the oxide superconductor filaments can be increased in the section of the multifilamentary oxide superconducting wire, and a larger current can be supplied. A metal matrix 23 having a rectangular section, as shown in FIG. 2C, can be used, a metal matrix 20 having a hole 24 at its central portion for passing a refrigerant therethrough, as shown in FIG. 2D or 2E, can be used, and a plurality array of flat oxide superconductor filament groups 26 concentrically arranged such that their wide directions are radially arranged, as shown in FIG. 2F, can be formed.

In the present invention, copper, a copper alloy, silver, a silver alloy, and other metals having good thermal and electric conductivities can be used as a material of the metal matrix, and silver and a silver alloy having a good oxygen permeability can be preferably used.

Bi—, Y—, and Tl-based oxide superconductors can be used. As the raw material of the oxide superconductor, in addition to an ordinary raw material powder, an intermediate before forming an oxide superconductor, e.g., a calcined material, which is obtained by blending, mixing and calcining primary material powders, as of an oxide and a carbonate, containing a constituent element of the oxide superconductor; a coprecipitated mixture obtained by mixing solutions of compounds containing a constituent element of the oxide superconductor to provide a desired composition; an oxygendeficient composite oxide; and an alloy of a constituent element of the oxide superconductor can be used.

The section of the oxide superconductor filament can be of an arbitrary shape, e.g., a rectangle, a fan shape, and an elongated ellipse, and may preferably be a flat shape so that the c-axis orientation of the crystal of the oxide superconductor is improved.

The section of the multifilamentary oxide superconducting wire is not limited to a circle but can be a rectangle, an ellipse, or any other arbitrary shape.

The present inventors have discovered that the flatter the section of the oxide superconductor filament, the better the c-axis orientation of the crystal of the oxide superconductor, and have reached the present invention.

In the oxide superconducting wire of the present invention, the c-axis orientation of the crystal of the oxide superconductor is improved by a flat oxide superconductor filament probably because of the following reason. That is, when the raw material is heated to form an oxide superconductor, the crystal of the metal of the metal matrix has a function to cause the crystal of the oxide superconductor to orient along the c-axis. Thus, when the contact area of the oxide superconductor filament with the metal matrix is increased, this function is enhanced.

A flatness $L^2/S$ (where L (mm) is a contact length of one oxide superconductor filament with the metal matrix in the section and S (mm$^2$) is a sectional area of one oxide superconductor filament) indicating the degree of flatness of an oxide superconductor layer is preferably 18 or more in terms of the c-axis orientation. If the flatness is less than 18, the c-axis orientation is insufficient to obtain the superconductivity.

In the oxide superconducting wire of the present invention, when the flat oxide superconductor filaments are arranged such that their wide directions are radially arranged, the thermal conductivity is increased. Generally, an oxide superconductor has a low thermal conductivity. When an oxide superconducting wire has a structure as shown in FIG. 1B, although the thermal conductivity in the widthwise direction is high, the thermal conductivity in the direction of thickness is low. As a result, the cooling capability of the oxide superconductor as a whole is decreased. Hence, when the oxide superconductor filaments are arranged such that their wide directions are radially arranged, as in the present invention, heat is readily conducted without being interfered by the oxide superconductor filaments.

A method of manufacturing a multifilamentary oxide superconducting wire according to the present invention will be described.

Figure 3A:
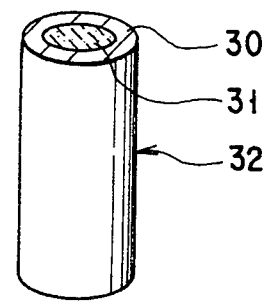
FIGS. 3A to 3G are views for explaining a method of manufacturing a multifilamentary oxide superconducting wire according to an embodiment of the present invention.
Figure 3B:
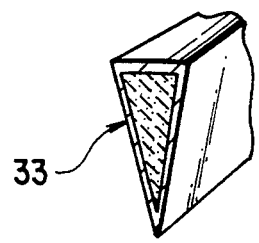
Figure 3C:
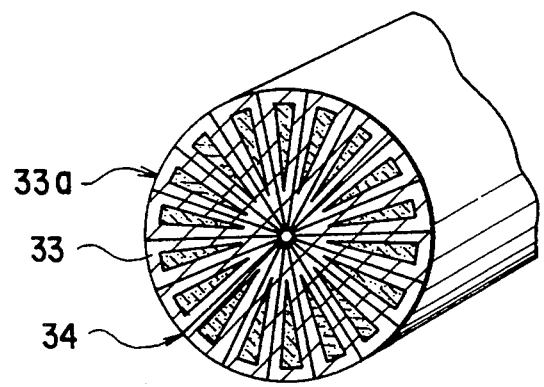
Figure 3D:
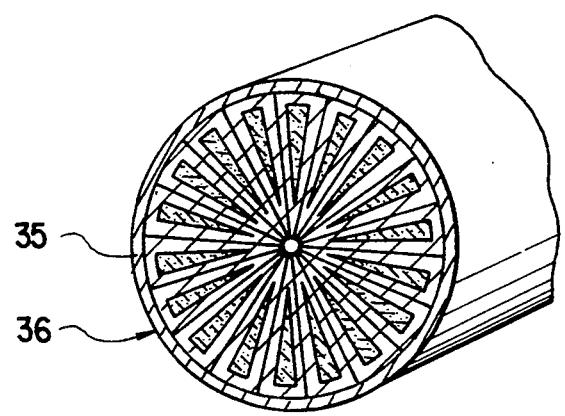
Figure 3E:
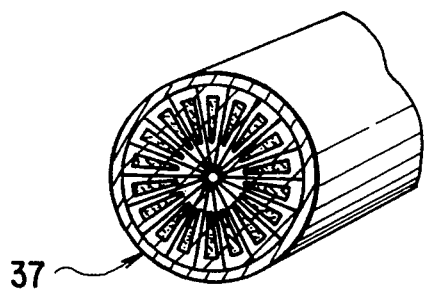
Figure 3F:
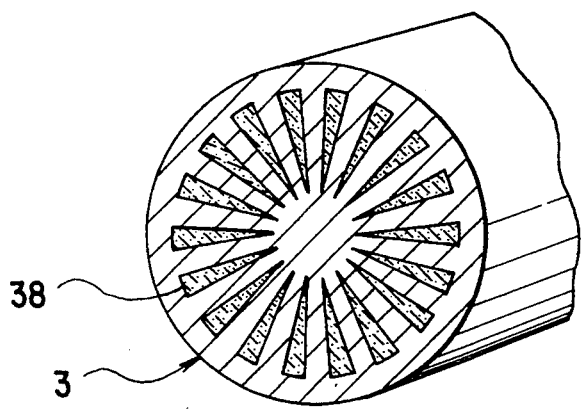
Figure 3G:
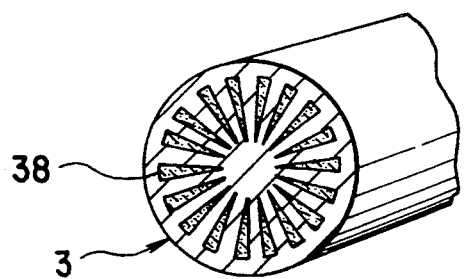

First, a raw material 31 of an oxide superconductor is filled in a metal pipe 30 to form a composite billet 32, as shown in FIG. 3A. Then, the composite billet 32 is subjected to a diameter reduction process, thus forming a composite wire 33 having a fan-like section, as shown in FIG. 3B. A plurality of composite wires 33 are arranged such that their arcuated portions 33a are located on the outer side, thus forming a composite wire arrangement 34, as shown in FIG. 3C. The composite wire arrangement 34 is arranged in a covering metal pipe 35 to form a metal-covered composite wire arrangement 36, as shown in FIG. 3D. The metal-covered composite wire arrangement 36 or an arranged wire assembly 37 shown in FIG. 3E obtained by subjecting the metal-covered composite wire arrangement 36 to a diameter reduction process is heated in a predetermined manner, thus obtaining a multifilamentary oxide superconducting wire 3 having oxide superconductor filaments 38 whose wide directions are radially arranged, as shown in FIG. 3F or 3G.

Figure 4A:
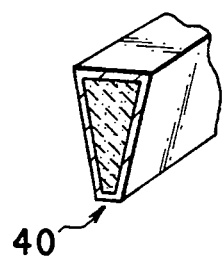
Figure 4B:
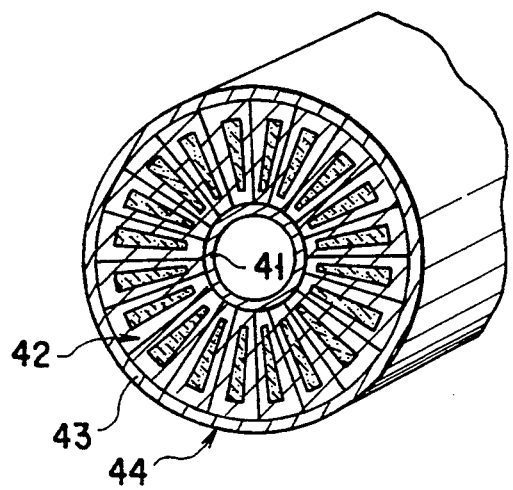

The composite billet described above is subjected to a diameter reduction process to form a composite wire 40 having a substantially trapezoidal section, as shown in FIG. 4A. A plurality of composite wires 40 are arranged on a metal pipe 41 such that their arcuated portions are on the outer side, as shown in FIG. 4B, thus forming a composite wire arrangement 42. The composite wire arrangement 42 is set in a covering metal pipe 43 to form a metal-covered composite wire arrangement 44. The metal-covered composite wire arrangement 44 is heated in a predetermined manner, thus obtaining a multifilamentary oxide superconducting wire 4 having oxide superconductor filaments 45 whose wide directions are radially arranged and a hole portion 46 for passing a refrigerant therethrough.

When the multifilamentary oxide superconducting wire is to be manufactured in the above manner, composite wires each having a fan-like section may be heated in a predetermined manner to cause the raw material to react to form an oxide superconductor, and thereafter an arrangement may be formed, thus shortening the heating time. In this case, however, the arrangement must be treated carefully in the following processes since the oxide superconductor filaments tend to easily crack.

In the manufacturing method described above, since the composite wire arrangement is set in the covering metal pipe, not only the arrangement wire assembly is fixed but also the workability is improved. Other than setting the composite wire arrangement in the covering metal pipe, the composite wire arrangement may be bound by a metal tape, or a metal material may be formed on the surface of the composite wire arrangement by vapor deposition to cover it.

As a method of filling the raw material in the metal pipe, a powdery raw material may be directly filled. Alternatively, a compact powder obtained by compacting a powdery raw material to have a predetermined form in accordance with CIP (Cold Isostatic Pressing) or a sintered body of a compact powder may be filled.

In the manufacturing method of the present invention, to reduce the diameter of the composite billet in which the raw material is filled in the metal pipe, normal methods including HIP (Hot Isostatic Pressing), extrusion, milling, drawing, swaging, and so on can be employed.

Figure 5A:
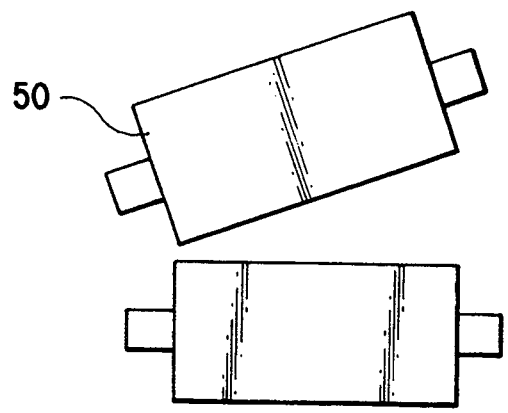
FIGS. 5A and 5B are views for explaining devices used for reducing the diameter of a composite wire in the present invention.
Figure 5B:
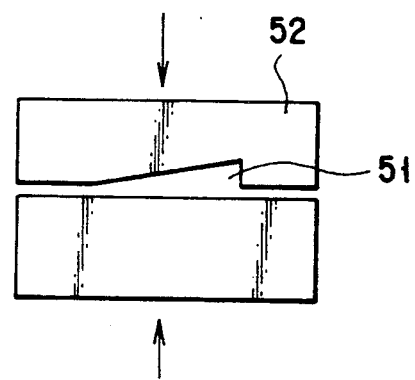

To reduce the diameter of the composite billet to form a composite wire having a fan-like section, after extrusion, the composite billet may be pressed by pressure rolls 50 having inclined shafts, as shown in FIG. 5A, or by a mold 52 having a hole portion 51 having a fan-like section, as shown in FIG. 5B. Alternatively, conform extrusion may be employed.

Regarding conditions of the heating process for causing the raw material of the oxide superconductor to react to form an oxide superconductor, the heating temperature is about 950° to 1,000° C. when the superconductor is a Y-based oxide superconductor, and is about 850° to 1,000° C. when the superconductor is a Bi- and Tl-based oxide superconductor, heating being performed in an oxygen-containing atmosphere in either case.

Figure 6A:
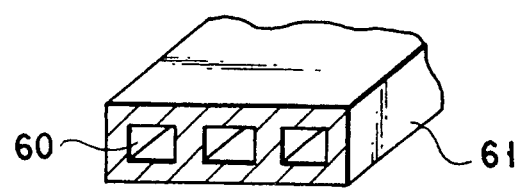

In the method of the multifilamentary oxide superconducting wire according to the present invention, when a plate-like metal member 61 having an array of through holes 60, as shown in FIG. 6A, is used, a multifilamentary oxide superconducting wire having an array of a plurality of stages of oxide superconductor filaments can be manufactured.

Figure 6B:
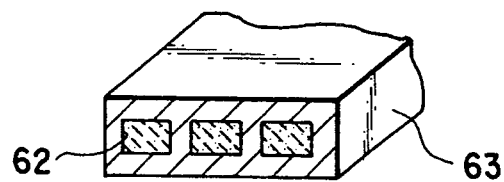
Figure 6C:
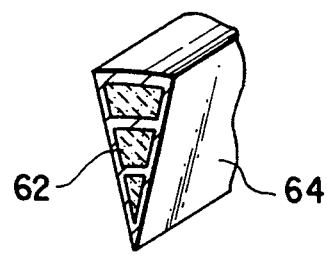
Figure 6D:
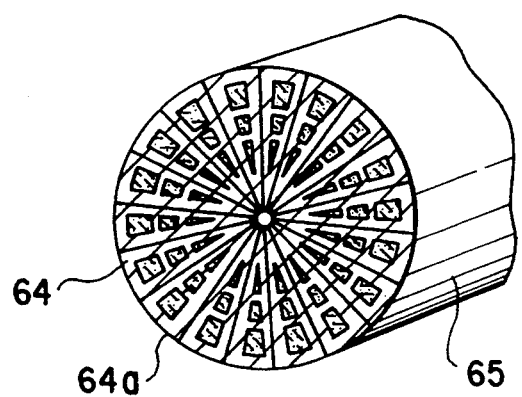
Figure 6E:
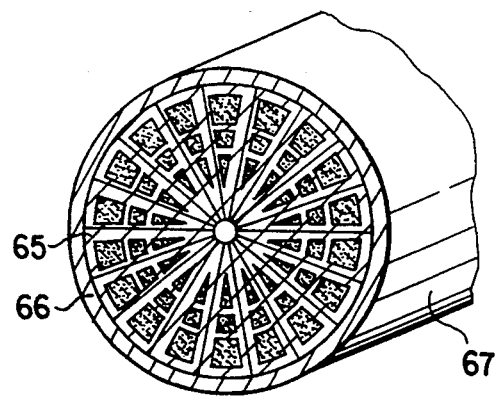
Figure 6F:
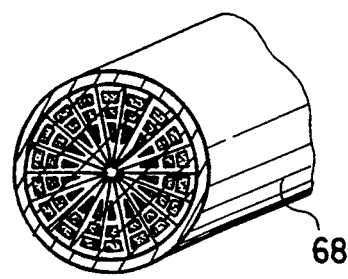
Figure 6G:
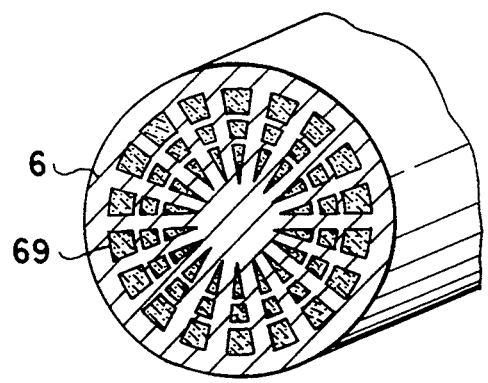
Figure 6H:
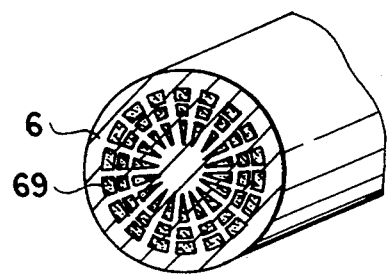

This multifilamentary oxide superconducting wire manufacturing method will be described. A raw material 62 of the oxide superconductor is filled in the through holes 60 of the plate-like metal member 61 shown in FIG. 6A to form a composite billet 63 shown in FIG. 6B. This composite billet 63 is subjected to a diameter reduction process to form a composite wire 64 having a fan-like section, as shown in FIG. 6C. A plurality of composite wires 64 are assembled such that their arcuated portions 64a are on the outer side, thus forming a composite wire arrangement 65, as shown in FIG. 6D. The composite wire arrangement 65 is set in a covering metal pipe 66 to form a metal-covered composite wire arrangement 67, as shown in FIG. 6E. The metal-covered composite wire arrangement 67 or an arranged wire assembly 68 shown in FIG. 6F obtained by subjecting the metal-covered composite wire arrangement 67 to a diameter reduction process is heated in a predetermined manner, thus obtaining a multifilamentary oxide superconducting wire 6 having concentric oxide superconductor filaments 69 whose wide directions are radially arranged, as shown in FIG. 6G or 6H.

Alternatively, the composite billet described above is subjected to a diameter reduction process to form a composite wire 71 having a substantially trapezoidal section and a plurality of through holes 70, as shown in FIG. 7A. A plurality of composite wires 71 are arranged on a metal pipe 72 such that their arcuated portions are on the outer side, as shown in FIG. 7B, thus forming a composite wire arrangement 73. The composite wire arrangement 73 is set in a covering metal pipe 74, thus forming a metal-covered composite wire arrangement 75. The arrangement 75 is heated in a predetermined manner, thus obtaining a multifilamentary oxide superconducting wire 7 having a plurality of concentric oxide superconductor filaments 76 whose wide directions are radially arranged and a hole portion 77 for passing a refrigerant therethrough.

Figure 8A:
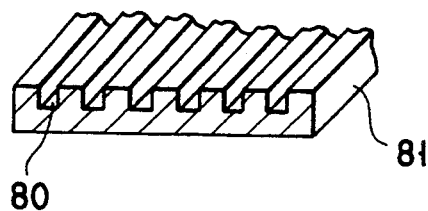
FIGS. 8A and 8B are views for explaining a method of manufacturing a composite billet in the present invention.
Figure 8B:
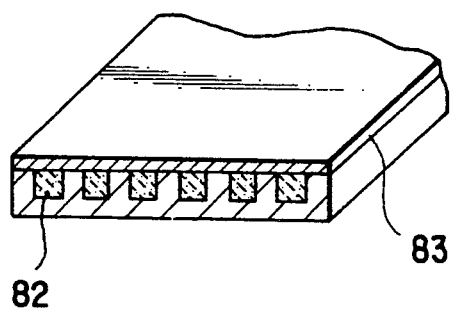

To form a composite billet, a plate-like metal member 81 having a plurality of grooves 80, as shown in FIG. 8A, may be prepared, a raw material 82 may be filled in the grooves 80, and a metal lid 83 may be placed on the plate-like metal member 81, as shown in FIG. 8B. According to this method, the filling operation is facilitated, and the raw material can be uniformly filled at a high density. When the raw material 82 is continuously filled while the grooved plate-like metal member 81 is caused to travel, a long composite billet can be efficiently manufactured.

Figure 9A:
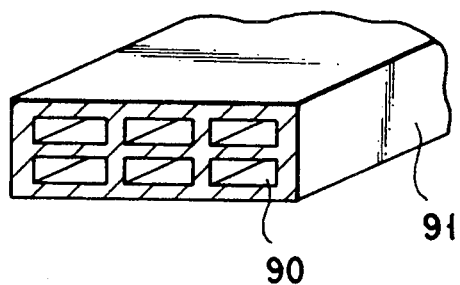
Figure 9B:
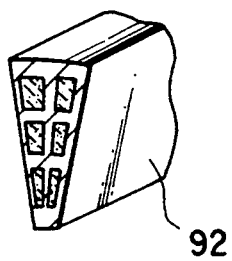

A plate-like metal member 91 having a plurality of through holes 90 formed in a plurality of arrays, as shown in FIG. 9A, may be used, and a composite 92 having a plurality of arrays of raw material layers and a fan-like section may be formed. When such a plate-like metal member 91 is used, the number of steps of the diameter reduction process can be reduced, and the composite billet can be efficiently manufactured.

Furthermore, a plate-like metal member 101 in which a plurality of through holes 100 are irregularly formed, as shown in FIG. 10A, may be used. With such a plate-like metal member 101, when a composite wire 102 having a fan-like section is formed, as shown in FIG. 10B, the density of the oxide superconductor can be increased.

Figure 11A:
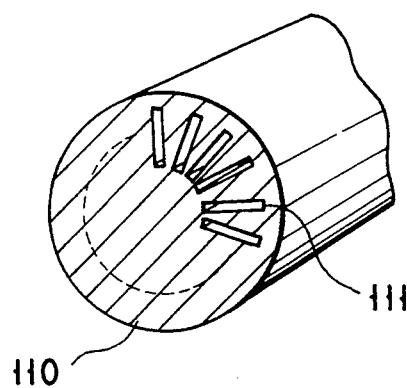
Figure 11B:
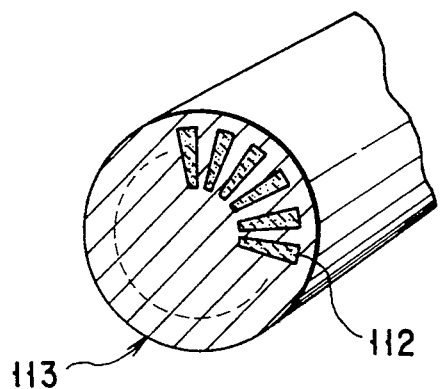
Figure 11C:
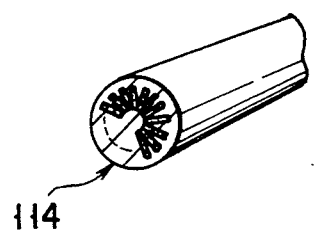

In the multifilamentary oxide superconducting wire manufacturing method according to the present invention, a plurality of through holes 111 each having a flat section may be formed in a rod-like metal member 110 serving as a metal matrix such that their wide directions are radially arranged, as shown in FIG. 11A. Then, a raw material 112 may be filled in the through holes 111 to form a composite billet 113, as shown in FIG. 11B. The composite billet 113 may be subjected to a diameter reduction process to form a composite wire 114. The composite wire 114 may be heated in a predetermined manner, thereby multifilamentary oxide superconducting wire.

EXAMPLE 1

$Bi_2O_3$, $SrCO_3$, $CaCO_3$, and CuO powders were blended such that Bi: Sr: Ca: Cu was 2:2:1:2 in an atomic ratio, mixed, calcined in an outer air at 820° C. for 50 hours, and pulverized to form a calcined powder having an average particle size of 5 $\mu$m.

The calcined powder was compacted and subjected to the CIP process to form a rod having a diameter of 15 mm. The rod was set in an Ag pipe having outer and inner diameters of 25 and 15 mm, respectively, thus forming a composite billet. The composite billet was extruded, thus obtaining a composite wire having a fan-like section with one arc of 0.2 mm, the other arc of 1 mm, and a width of 5 mm. This composite wire was finished using the mold shown in FIG. 5B.

A desired number of thus-obtained composite wires were arranged such that their larger arcs were located on the outer side to form a composite wire arrangement. An Ag tape having a thickness of 0.2 mm was wound on the circumferential surface of the composite wire arrangement, thus forming an Ag-covered composite wire arrangement.

Then, the Ag-covered arrangement was heated at 850° C. for 50 hours in a stream of oxygen, thus forming a multifilamentary oxide superconducting wire having a section shown in FIG. 3F.

EXAMPLE 2

A calcined powder obtained as in Example 1 was compacted and subjected to the CIP process to form a rod having a diameter of 15 mm. The rod was set in an Ag pipe having outer and inner diameters of 25 and 15 mm, respectively, thus forming a composite billet. The composite billet was swaged and extruded to form a wire. The wire was pressed using the mold shown in FIG. 5B, thus obtaining a composite wire having a fan-like section with one arc of 1 mm, the other arc of 2 mm, and a width of 5 mm.

A desired number of thus-obtained composite wires were arranged on an Ag pipe having outer and inner diameters of 10 and 6 mm, respectively, such that their larger arcs were located on the outer side to form a composite wire arrangement. An Ag tape having a thickness of 0.2 mm was wound on the circumferential surface of the composite wire arrangement, thus forming an Ag-covered composite wire arrangement.

Figure 4C:
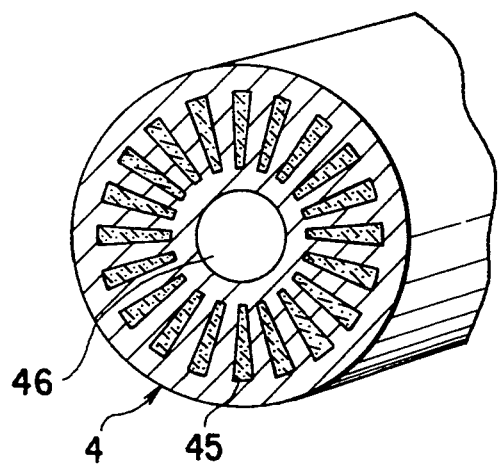

Then, the Ag-covered composite wire arrangement was heated at 850° C. for 50 hours in a stream of oxygen, thus forming a multifilamentary oxide superconducting wire having a section shown in FIG. 4C.

EXAMPLE 3

An Ag pipe having a thickness of 2 mm was fitted on a composite wire arrangement obtained as in Example 1 to form a metal-covered composite wire arrangement. The metal-covered composite wire arrangement was swaged to form an arranged wire assembly having an outer diameter of 8 mm. This assembly was heated at 850° C. for 50 hours in a stream of oxygen, thus forming a multifilamentary oxide superconducting wire having a section shown in FIG. 3G.

EXAMPLE 4

A multifilamentary oxide superconducting wire having a section shown in FIG. 4C was manufactured by following the same procedures as in Example 2 except that a calcined powder having an average particle size of 5 $\mu$m, which had been obtained by blending $Bi_2O_3$, PbO, $SrCO_3$, $CaCO_3$, and CuO powders such that Bi: Pb: Sr: Ca: Cu was 1.6:0.4:2:2:3 in an atomic ratio, mixing, calcining in an outer air at 750° C. for 50 hours, and pulverizing, was used.

Control 1

A calcined powder obtained as in Example 1 was compacted and subjected to the CIP process to obtain a rod having a diameter of 20 mm. An Ag rod having an outer diameter of 100 mm and seven through holes formed at the same pitch and each having an outer diameter of 20 mm was prepared. Seven rods thus obtained were inserted in the through holes of the Ag rod to form a composite billet. The composite billet was swaged and heated following the same procedures as in Example 1, thus forming a multifilamentary oxide superconducting wire having an outer diameter of 10 mm and a section shown in FIG. 1A.

Control 2

A calcined powder obtained as in Example 2 was compacted and subjected to the CIP process to form a rod having a diameter of 12 mm. This rod was set in an Ag pipe having outer and inner diameters of 20 and 12 mm, respectively. The obtained structure was swaged and milled to form a tape-like rectangular wire having a width of 5 mm and a thickness of 0.2 mm.

A plurality of tape-like wires thus obtained were aligned in a square Ag pipe having outer and inner sides of 40 and 30 mm, respectively, to form a composite billet. This composite billet was milled to form a multifilamentary oxide superconducting wire having a thickness of 4 mm and a width of 18 mm.

This multifilamentary oxide superconducting wire was heated following the same procedures as in Example 2, thus forming a multifilamentary oxide superconducting wire having a section shown in FIG. 1B.

The critical temperature (Tc) and the critical current density (Jc) in a liquid nitrogen of each of the multifilamentary oxide superconducting wires manufactured in Examples 1 to 4 and Controls 1 and 2 were measured in normal measuring methods. Table 1 shows the results.

TABLE 1

Figure 1A:
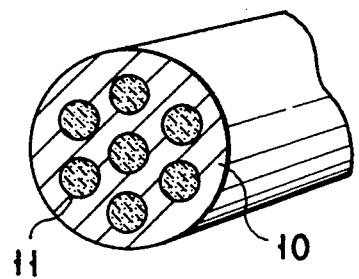
FIGS. 1A to 1C are views showing sections of conventional multifilamentary oxide superconducting wires.
Figure 1B:
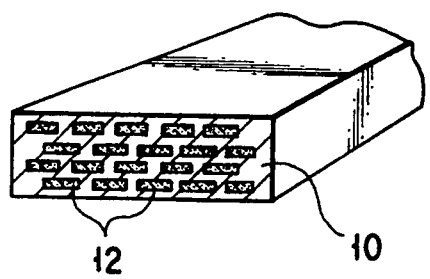

|  | Type of Super-conductor | Section of Multifila-mentary oxide superconduct-ing wire | Tc (K) | Jc (A/cm$^2$) |
| --- | --- | --- | --- | --- |
| Example 1 | Bi-based | FIG. 3F | 88 | 7,500 |
| Example 2 | Bi-based | FIG. 4C | 90 | 8,380 |
| Example 3 | Bi-based | FIG. 3G | 92 | 8,750 |
| Example 4 | Bi-Pb-based | FIG. 4C | 95 | 9,800 |
| Control 1 | Bi-based | FIG. 1A | 82 | 1,100 |
| Control 2 | Bi-based | FIG. 1B | 90 | 3,500 |

As is apparent from Table 1, the multifilamentary oxide superconducting wires of Examples 1 to 4 had large Tc and Jc values. In particular, the superconductor of Example 2 exhibited an excellent superconducting property as cooling was promoted inside the superconductor. In the superconductor of Example 3, since the metal-covered arrangement was subjected to diameter reduction process, the adhesion strength of the composite wires was increased to enhance the cooling effect, thus exhibiting an excellent superconducting property.

In contrast to these, in Control 1, since the oxide superconductor filaments had a circular section, the density of the oxide superconductors was low to degrade the superconducting property. In Control 2, since the oxide superconductor filaments interfered with thermal conduction in the direction of thickness, the cooling effect was low. Jc values were small in both Controls 1 and 2.

EXAMPLE 5

$Bi_2O_3$, $SrCO_3$, $CaCO_3$, and CuO powders were blended such that Bi: Sr: Ca: Cu was 2:2:1:2 in an atomic ratio, mixed, calcined in an outer air at 820×C for 50 hours, and pulverized to form a calcined powder having an average particle size of 5 $\mu$m.

The calcined powder was compacted and subjected to the CIP process to form a rod having a size of 2 mm×2 mm. An Ag pipe in which three through holes each having a size of 2 mm×2 mm were formed in an array and which has an thickness of 4 mm and a width of 10 mm was prepared. Rods thus obtained were filled in the through holes of this Ag pipe, thus forming a composite billet. The composite billet was extruded, thus obtaining a composite wire having a fan-like section with one arc of 0.2 mm, the other arc of 2 mm, and a width of 10 mm. The composite wire was finished using the milling rolls shown in FIG. 5A.

A desired number of thus-obtained composite wires were arranged such that their larger arcs were located on the outer side to form a composite wire arrangement. An Ag tape having a thickness of 0.2 mm was wound on the circumferential surface of the composite wire arrangement, thus forming an Ag-covered composite wire arrangement.

Then, the Ag-covered composite wire arrangement was heated at 850° C. for 50 hours in a stream of oxygen, thus forming a multifilamentary oxide superconducting wire having a section shown in FIG. 6D.

EXAMPLE 6

An Ag pipe in which three through holes each having a size of 2 mm×2 mm were formed in an array and which had an outer diameter of 4 mm and a length of 8 mm was prepared. Rods manufactured as in Example 5 were filled in the through holes of the Ag pipe, thus forming a composite billet. The composite billet was extruded and pressed using the mold shown in FIG. 5B, thus obtaining a composite wire having a fan-like section with one arc of 0.7 mm, the other arc of 2 mm, and a width of 8 mm.

A desired number of thus-obtained composite wires were arranged on an Ag pipe having outer and inner diameters of 8 and 6 mm, respectively, such that their larger arcs were located on the outer side to form a composite wire arrangement. An Ag tape having a thickness of 0.2 mm was wound on the circumferential surface of the composite wire arrangement, thus forming an Ag-covered composite wire arrangement.

Then, the Ag-covered composite wire arrangement was heated at 825° C. for 50 hours in an outer atmosphere, thus forming a multifilamentary oxide superconducting wire having a section shown in FIG. 7C.

EXAMPLE 7

An Ag pipe having a thickness of 2 mm was fitted on a composite wire arrangement obtained as in Example 5 to form an Ag-covered composite wire arrangement. The Ag-covered composite wire arrangement was swaged to form an arranged wire assembly having an outer diameter of 8 mm. This assembly was heated at 850° C. for 50 hours in a stream of oxygen, thus forming a multifilamentary oxide superconducting wire having a section shown in FIG. 6H.

EXAMPLE 8

A multifilamentary oxide superconducting wire having a section shown in FIG. 7C was manufactured by following the same procedures as in Example 6 except that a calcined powder having an average particle size of 5 $\mu$m, which had been obtained by blending $Bi_2O_3$, PbO, $SrCO_3$, $CaCO_3$, and CuO powders such that Bi: Pb: Sr: Ca: Cu was 1.6:0.4:2:2:3 in an atomic ratio, mixing, calcining in an outer air at 750° C. for 50 hours, and pulverizing, was used.

Control 3

A calcined powder obtained as in Example 5 was compacted and subjected to the CIP process to obtain a rod having a diameter of 20 mm. An Ag rod having an outer diameter of 100 mm and seven through holes formed at the same pitch and each having an outer diameter of 20 mm was prepared. Seven rods thus obtained were inserted in the through holes of the Ag rod to form a composite billet. The composite billet was swaged and heated following the same procedures as in Example 5, thus forming a multifilamentary oxide superconducting wire having a section shown in FIG. 1A.

Control 4

A calcined powder obtained as in Example 5 was compacted and subjected to the CIP process to form a rod having a diameter of 12 mm. This rod was filled in an Ag pipe having outer and inner diameters of 20 and 12 mm, respectively. The obtained structure was swaged and milled to form a singlefilamentary oxide superconducting wire having an outer diameter of 1 mm. A plurality of oxide superconducting wires thus obtained were inserted in an Ag pipe having outer and inner sides of 34 mm and 26 mm, respectively, thus forming a composite billet. The composite billet was milled to form a multifilamentary oxide superconducting wire having an outer diameter of 20 mm.

Figure 1C:
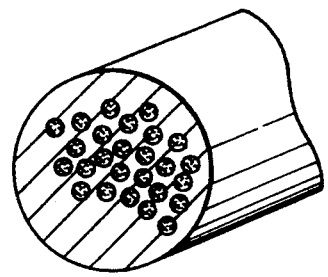

This multifilamentary oxide superconducting wire was heated following the same procedures as in Example 5, thus forming a multifilamentary oxide superconducting wire having a section shown in FIG. 1C. That is, in the section of this multifilamentary oxide superconducting wire, oxide superconductor filaments 11 were dispersed in a metal matrix 10.

The critical temperature (Tc) and the critical current density (Jc) in a liquid nitrogen of each of the multifilamentary oxide superconducting wires manufactured in Examples 5 to 8 and Controls 3 and 4 were measured. Table 2 shows the results together with the number of oxide superconductor filaments, i.e., the number of cores.

TABLE 2

| | Type of Superconductor | Section of Multifilamentary oxide superconducting wire | Tc(K) | Number of Cores | Jc (A/cm$^2$) |
|---|---|---|---|---|---|
| Example 5 | Bi-based | FIG. 6D | 88 | 102 | 7,500 |
| Example 6 | Bi-based | FIG. 7C | 90 | 69 | 8,380 |
| Example 7 | Bi-based | FIG. 6H | 92 | 93 | 8,750 |
| Example 8 | Bi-Pb-based | FIG. 7C | 95 | 69 | 9,800 |
| Control 3 | Bi-based | FIG. 1A | 82 | 7 | 1,100 |
| Control 4 | Bi-based | FIG. 1B | 90 | 80 | 3,500 |

As is apparent from Table 2, the multifilamentary oxide superconducting wires of Examples 5 to 8 had large Tc and Jc values. In particular, the superconductor of Example 6 exhibited an excellent superconducting property as cooling was promoted inside the superconductor. In the superconductor of Example 7, since the metal-covered arrangement was subjected to diameter reduction process, the adhesion strength of the composite wires was increased to enhance the cooling effect, thus exhibiting an excellent superconducting property.

In contrast to these, in Control 3, since the oxide superconductor filaments had a circular section and thus provided a large area with a small number of cores, the density of the oxide superconductors was low to degrade the superconducting property. In Control 4, since the singlefilamentary oxide superconducting wires were inserted in metal pipes in a one-to-one correspondence to provide a multifilamentary oxide superconducting wire, the wires locally intersected with each other. The intersecting portions were abnormally deformed. Jc values were small in both Controls 3 and 4.

EXAMPLE 9

$Bi_2O_3$, $SrCO_3$, $CaCO_3$, and $CuO$ powders were blended such that Bi: Sr: Ca: Cu was 2:2:1:2 in an atomic ratio, mixed, calcined in an outer air at 820° C. for 50 hours, and pulverized to form a calcined powder.

The calcined powder was compacted and subjected to the CIP process to form a desired number of compacted bodies each having a rectangular section, a width of 10 mm, and a different thickness, i.e., a different flatness. Through holes each having the same section as that of each compacted body were formed in an Ag pipe having an outer diameter of 30 mm such that their wide directions were radially arranged. The compacted bodies were inserted in the through holes, thus forming a composite billet. The number of through holes was adjusted such that the total sectional area of the through holes was identical in all composite billets.

The composite billet was swaged to form an oxide superconducting wire having an outer diameter of 2 mm. The oxide superconducting wire was heated at 850° C. for 50 hours in a stream of oxygen, thus forming a multifilamentary oxide superconducting wire having the same section as that shown in FIG. 2A.

EXAMPLE 10

A desired number of compacted bodies each having a rectangular section, a width of 10 mm, and a different thickness, i.e., a different flatness were formed by compacting and performing the CIP process of the calcined powder obtained as in Example 9. Through holes each having the same section as that of each compacted body were formed in an Ag pipe having outer and inner diameters of 30 mm and 5 mm such that their longitudinal directions were radially arranged. The compacted bodies were inserted in the through holes, thus forming a composite billet. The number of through holes was adjusted such that the total sectional area of the through holes was identical in all composite billets.

The composite billet was swaged to form a multifilamentary oxide superconducting wire having an outer diameter of 10 mm. The oxide superconducting wire was heated at 850° C. for 50 hours in a stream of oxygen, thus forming a multifilamentary oxide superconducting wire having the same section as that shown in FIG. 2E.

EXAMPLE 11

A multifilamentary oxide superconducting wire having a section shown in FIG. 2E was manufactured by following the same procedures as in Example 10 except that a calcined powder having an average particle size of 5 μm, which had been obtained by blending $Bi_2O_3$, PbO, $SrCO_3$, $CaCO_3$, and CuO powders such that Bi: Pb: Sr: Ca: Cu was 1.6:0.4:2:2:3 in an atomic ratio, mixing, calcining in an outer air at 750° C. for 50 hours, and pulverizing, was used.

CONTROL 5

A calcined powder obtained as in Example 9 was compacted and subjected to the CIP process to obtain a rod having a diameter 5 mm. An Ag rod having an outer diameter of 25 mm and seven through holes formed at the same pitch and each having an outer diameter of 5 mm was prepared. Seven rods thus obtained were inserted in the through holes of the Ag rod bar to form a composite billet. The composite billet was swaged and heated following the same procedures as in Example 9, thus forming a multifilamentary oxide superconducting wire having an outer diameter of 2 mm and a section shown in FIG. 1A.

CONTROL 6

A calcined powder obtained as in Example 10 was compacted and subjected to the CIP process to form a rod having a diameter of 12 mm. This rod was set in an Ag pipe having outer and inner diameters of 20 and 12 mm, respectively. The obtained structure was swaged and milled to form a tape-like wire having a rectangular section, a width of 5 mm, and a thickness of 0.2 mm.

A plurality of tape-like wires thus obtained were inserted in a square Ag pipe having outer and inner sides of 40 mm and 30 mm, respectively, thus forming a composite billet. The composite billet was milled to form a multifilamentary oxide superconducting wire having a thickness of 1 mm and a width of 3 mm.

This multifilamentary oxide superconducting wire was heated following the same procedures as in Example 10, thus forming a multifilamentary oxide superconducting wire having a section shown in FIG. 1B.

The critical temperature (Tc) and the critical current density (Jc) in a liquid nitrogen of each of the multifilamentary oxide superconducting wires manufactured in Examples 9 to 11 and Controls 5 and 6 were measured in normal measuring methods. Table 3 shows the results.

TABLE 3

| Type of Super-conductor | Section of Multifilamentary oxide superconducting wire | Flatness of Super-conductor filament ($L^2/S$) | Tc (K) | Jc (A/cm$^2$) |
| --- | --- | --- | --- | --- |
| Example 9 | Bi-based | FIG. 2A | 88 | 91 | 8,380 |
| | Bi-based | FIG. 2A | 48 | 90 | 7,500 |
| | Bi-based | FIG. 2A | 32 | 89 | 7,250 |
| | Bi-based | FIG. 2A | 20 | 89 | 6,000 |
| Example 10 | Bi-based | FIG. 2E | 62 | 92 | 8,750 |
| | Bi-based | FIG. 2E | 45 | 91 | 7,750 |
| | Bi-based | FIG. 2E | 33 | 90 | 7,500 |
| | Bi-based | FIG. 2E | 18 | 89 | 6,100 |
| Example 11 | Bi-based | FIG. 2E | 45 | 95 | 10,000 |
| Control 5 | Bi-based | Fig. 1A | 13 | 82 | 1,100 |
| Control 6 | Bi-based | Fig. 1B | 45 | 89 | 3,600 |

As is apparent from Table 3, the multifilamentary oxide superconducting wires of Examples 9 to 11 had large Tc and Jc values.

In contrast to these, in Control 5, since the oxide superconductor filaments had a circular section, its crystal had poor c-axis orientation. In Control 6, since the oxide superconductor filaments interfered with thermal conduction in the direction of thickness, the cooling effect was low, and the Jc value was small.

EXAMPLE 12

$Y_2O_3$, $BaCO_3$, and CuO powders were blended such that Y: Ba: Cu was 1:2:3 in an atomic ratio, mixed, calcined in an outer air at 900° C. for 100 hours, and pulverized to form a calcined powder having an average particle size of 5 μm.

The calcined powder was compacted and subjected to the CIP process to form a desired number of compacted bodies each having a rectangular section, a width of 10 mm, and a different thickness, i.e., a different flatness. Through holes each having the same section as that of each compacted body were formed in an Ag pipe having an outer diameter of 30 mm such that their wide directions were radially arranged. The compacted bodies were inserted in the through holes, thus forming a composite billet. The number of through holes was adjusted such that the total sectional area of the through holes was identical in all composite billets.

The composite billet was swaged and milled to form an oxide superconducting wire having an outer diameter of 2 mm. The oxide superconducting wire was heated at 920° C. for 20 hours in a stream of oxygen, thus forming a multifilamentary oxide superconducting wire having the same section as that shown in FIG. 2A.

EXAMPLE 13

A multifilamentary oxide superconducting wire having a section shown in FIG. 2A was manufactured by following the same procedures as in Example 12 except that a calcined powder having an average particle size of 5 μm, which had been obtained by blending $Tl_2O_3$, $BaCO_3$, $CaCO_3$, and CuO powders such that Tl: Ba: Ca: Cu was 2:2:2:3 in an atomic ratio, mixing, calcining in an outer air at 750° C. for 20 hours, and pulverizing, was used. In this case, the heat treatment is performed under a condition of 850° C.×50 hours.

CONTROL 7

A calcined powder obtained as in Example 12 was compacted and subjected to the CIP process to obtain a rod having a diameter 5 mm. An Ag rod having an outer diameter of 25 mm and seven through holes formed at the same pitch and each having an outer diameter of 5 mm was prepared. Seven rods thus obtained were inserted in the through holes of the Ag rod to form a composite billet. The composite billet was swaged and heated following the same procedures as in Example 12, thus forming a multifilamentary oxide superconducting wire having an outer diameter of 2 mm and a section shown in FIG. 1A.

CONTROL 8

A calcined powder obtained as in Example 13 was compacted and subjected to the CIP process to obtain a rod having a diameter 5 mm. An Ag rod having an outer diameter of 25 mm and seven through holes formed at the same pitch and each having an outer diameter of 5 mm was prepared. Seven rods thus obtained were inserted in the through holes of the Ag rod to form a composite billet. The composite billet was swaged and heated following the same procedures as in Example 12, thus forming a multifilamentary oxide superconducting wire having an outer diameter of 2 mm and a section shown in FIG. 1A.

The critical temperature (Tc) and the critical current density (Jc) in a liquid nitrogen of each of the multifilamentary oxide superconducting wires manufactured in Examples 12 and 13 and Controls 7 and 8 were measured in normal measuring methods. Table 4 shows the results.

TABLE 4

| Type of Super-conductor | Section of Multifilamentary oxide superconducting wire | Flatness of Super-conductor filament (L2/S) | Tc (K) | Jc (A/cm$^2$) |
| --- | --- | --- | --- | --- |
| Example 12 | Y-based | FIG. 2A | 89 | 91 | 2,930 |
| | Y-based | FIG. 2A | 50 | 92 | 2,850 |
| | Y-based | FIG. 2A | 35 | 90 | 2,900 |
| | Y-based | FIG. 2A | 20 | 89 | 2,500 |
| Example 13 | Tl-based | FIG. 2A | 65 | 110 | 13,600 |
| | Tl-based | FIG. 2A | 42 | 115 | 12,100 |
| | Tl-based | FIG. 2A | 34 | 112 | 12,000 |
| | Tl-based | FIG. 2A | 18 | 110 | 8,500 |
| Control 7 | Y-based | FIG. 1A | 13 | 88 | 850 |
| Control 8 | Tl-based | FIG. 1A | 13 | 108 | 3,400 |

As is apparent from Table 4, the multifilamentary oxide superconducting wires of Examples 12 and 13 had large Tc and Jc values.

In contrast to these, in Control 5, since the oxide superconductor filaments had a circular section, its crystal had poor c-axis orientation.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A multifilamentary oxide superconducting wire, comprising a metal matrix and a plurality of oxide superconductor filaments each having an oblong cross section and arranged in said metal matrix such that a longer side of said oblong cross section extends in a radial direction of the oxide superconducting wire, wherein said oxide superconductor filaments have a flatness ($L^2/S$) of not less than 18, where L (mm) is a peripheral length in cross section of the oxide superconductor filaments, and S (mm$^2$) is a cross sectional area of the oxide superconductor filaments.

2. The superconducting wire according to claim 1, wherein said oxide superconductor filaments are arranged to form a plurality of arrays concentric with each other.

3. The superconducting wire according to claim 2, wherein said oxide superconductor filaments in each of the composite wires are arranged in a non-linear configuration.

4. The superconducting wire according to claim 1, wherein said oxide superconductor filaments have a cross sectional shape selected from the group consisting of a rectangular shape, a polygonal shape, an elliptical shape and a fan-like shape.

5. The superconducting wire according to claim 1, wherein said metal matrix is interposed between a metal pipe and said outer layer.

6. The superconducting wire according to claim 1, wherein said oxide superconductor is formed of a material selected from the group consisting of a Y-based material, a Bi-based material, and a Tl-based material.

* * * * *